(12) United States Patent
Hekmatshoartabari et al.

(10) Patent No.: US 10,957,252 B2
(45) Date of Patent: *Mar. 23, 2021

(54) ACTIVE MATRIX OLED DISPLAY WITH NORMALLY-ON THIN-FILM TRANSISTORS

(71) Applicant: INTERNATIONAL BUSINESS MACHINES CORPORATION, Armonk, NY (US)

(72) Inventors: Bahman Hekmatshoartabari, White Plains, NY (US); Ghavam G. Shahidi, Pound Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/541,394

(22) Filed: Aug. 15, 2019

(65) Prior Publication Data
US 2019/0371246 A1    Dec. 5, 2019

Related U.S. Application Data

(63) Continuation of application No. 16/016,025, filed on Jun. 22, 2018, now Pat. No. 10,586,493, which is a
(Continued)

(51) Int. Cl.
*G09G 3/32*    (2016.01)
*G09G 3/3233* (2016.01)
(Continued)

(52) U.S. Cl.
CPC ......... *G09G 3/3233* (2013.01); *G09G 3/3258* (2013.01); *G09G 3/3266* (2013.01);
(Continued)

(58) Field of Classification Search
CPC ................ G09G 3/322; G09G 3/3266; G09G 2300/0842; H01L 27/3262; H01L 27/3244; H01L 29/165; H01L 29/802
See application file for complete search history.

(56) References Cited

U.S. PATENT DOCUMENTS 5,350,936 A * 9/1994 Ikalainen ............. H01L 29/802
257/194
9,153,174 B2   10/2015 Tang
(Continued)

OTHER PUBLICATIONS

Kim, B. et al., "A Depletion-Mode a-IGZO TFT Shift Register With a Single Low-Voltage-Level Power Signal" IEEE Electron Device Letters (Aug. 2011) pp. 1092-1094, vol. 32, No. 8.
(Continued)

*Primary Examiner* — Liliana Cerullo
(74) *Attorney, Agent, or Firm* — Tutunjian & Bitetto, P.C.; Erik Johnson

(57) ABSTRACT

A pixel circuit includes a first transistor, a second transistor connected to a first source/drain of the first transistor, a circuit element connected to a gate of the first transistor and ground and configured to receive a select input and maintain the select input less than or equal to a potential of the ground, and a resistive element connected to an organic light emitting diode (OLED) and a first source/drain of the second transistor.

18 Claims, 7 Drawing Sheets

Related U.S. Application Data continuation of application No. 15/345,248, filed on Nov. 7, 2016, now Pat. No. 10,068,529.

(51) Int. Cl.
    *G09G 3/3266*     (2016.01)
    *H01L 29/165*     (2006.01)
    *G09G 3/3258*     (2016.01)
    *H01L 27/32*     (2006.01)
    *H01L 29/80*     (2006.01)
    *H01L 27/12*     (2006.01)
    *H01L 29/16*     (2006.01)

(52) U.S. Cl.
    CPC ...... *H01L 27/3248* (2013.01); *H01L 27/3262* (2013.01); *H01L 27/3265* (2013.01); *H01L 29/165* (2013.01); *H01L 29/802* (2013.01); *G09G 2300/0842* (2013.01); *G09G 2310/08* (2013.01); *H01L 27/1229* (2013.01); *H01L 29/16* (2013.01); *H01L 2227/323* (2013.01)

(56) References Cited

U.S. PATENT DOCUMENTS

| | | | |
|---|---|---|---|
| 9,166,181 | B2 | 10/2015 | Afzali-Ardakani et al. |
| 10,068,529 | B2* | 9/2018 | Hekmatshoartabari ............... H01L 27/3265 |
| 2006/0092183 | A1 | 5/2006 | Malmberg |
| 2006/0279352 | A1 | 12/2006 | Kim et al. |
| 2008/0030495 | A1* | 2/2008 | Shirasaki ............ G09G 3/3233 345/214 |
| 2009/0146927 | A1 | 6/2009 | Wan et al. |
| 2010/0283061 | A1* | 11/2010 | Kelley ............... H03K 17/145 257/77 |
| 2013/0157399 | A1 | 6/2013 | Park et al. |
| 2013/0175512 | A1* | 7/2013 | Kim .................... H01L 51/5004 257/40 |
| 2015/0028289 | A1 | 1/2015 | Hekmatshoartabari et al. |
| 2015/0200241 | A1* | 7/2015 | Kim .................... G09G 3/3233 257/40 |
| 2015/0236282 | A1* | 8/2015 | Afzali-Ardakani .......................... H01L 27/3274 257/40 |
| 2016/0099300 | A1 | 4/2016 | Lee et al. |
| 2018/0204895 | A1* | 7/2018 | Lin .................... G09G 3/3233 |
| 2018/0342205 | A1 | 10/2018 | Wang et al. |
| 2019/0074340 | A1 | 3/2019 | Cai |
| 2019/0197958 | A1 | 6/2019 | Yen |

OTHER PUBLICATIONS

Song, E. et al., "Depletion Mode Oxide TFT Shift Register for Variable Frame Rate AMOLED Displays" IEEE Electron Device Letters (Mar. 2015) pp. 247-249, vol. 36, No. 3.

Doutreloigne, J. et al., "Design of an Integrated OLED Driver for a Modular Large-Area Lighting System" Recent Advances in Electrical and Computer Engineering (May 2013) pp. 172-176.

Kim, B. et al., "New Depletion-Mode IGZO TFT Shift Register" IEEE Electron Device Letters (Feb. 2011) pp. 158-160, vol. 32, No. 2.

Park, S-J, "A development of noise improvement dc-dc converter for PM OLED module" Journal of IKEEE (2009) 248-252, vol. 13, No. 2.

List of IBM Patents or Patent Applications Treated as Related dated Aug. 15, 2019, 2 pages.

\* cited by examiner

ACTIVE MATRIX OLED DISPLAY WITH NORMALLY-ON THIN-FILM TRANSISTORS

BACKGROUND

Technical Field

The present invention generally relates to display circuits, and more particularly to a pixel circuit having a pixel current control resistor and a capacitor/diode stage.

Description of the Related Art

Currently, low-temperature poly-silicon (LTPS) is a dominant thin-film transistor (TFT) technology employed in display backplanes of portable and handheld electronic devices (and almost exclusively for cell phones), due to higher performance which permits relatively lower power consumption and also scalability to lower dimensions needed for high display resolutions. However, LTPS is significantly more expensive than amorphous Si (a-Si or a-Si:H) and also requires process temperatures (e.g., 400-600° C.) which are too high for low-cost glass or plastic substrates. While LTPS can be prepared essentially at room-temperature, given short laser pulses (~10-50 ns) used for crystallization and the rapid dissipation of the locally generated heat, the thin film transistor (TFT) fabrication process still needs high temperatures to ensure sufficient TFT performance and gate dielectric reliability.

In addition, while LTPS TFTs are more stable than a-Si:H TFTs, they are still less stable than Si VLSI devices (particularly n-channel devices which suffer from floating body/kink effects in addition to gate dielectric reliability issues). The device-to-device variation of threshold voltage requires circuit compensation techniques that reduce the display resolution due to the additional LTPS TFTs used in the pixel.

SUMMARY

In accordance with an embodiment of the present invention, a pixel circuit includes a first capacitor and diode stage connected to a gate of a first transistor and ground, which receives a select input. A data line is coupled to a first source/drain of the first transistor, and a second source/drain of the first transistor is coupled to a gate of a second transistor. The second transistor has a drain connected to a supply voltage and a source connected to a resistor. The resistor connects to an organic light emitting diode (OLED), which connects to the ground.

Another pixel circuit includes a circuit element connected to a gate of a first transistor and ground, which receives a select input and maintains the select input less than or equal to a potential of the ground. A data line is coupled to a first source/drain of the first transistor, and a second source/drain of the first transistor is coupled to a gate of a second transistor. The second transistor has a drain connected to a supply voltage and a source connected to a resistive element. The resistive element connects to an organic light emitting diode (OLED), which connects to the ground.

Another pixel circuit includes a circuit element connected to a gate of a first transistor and ground, which receives a select input and downshifts the select input in accordance with a pinch off voltage of the first transistor. A data line is coupled to a first source/drain of the first transistor, and a second source/drain of the first transistor is coupled to a gate of a second transistor. The second transistor has a drain connected to a supply voltage and a source connected to a resistive element. The resistive element connects to an organic light emitting diode (OLED), which connects to the ground.

Another pixel circuit includes a first transistor, a second transistor connected to a first source/drain of the first transistor, a circuit element connected to a gate of the first transistor and ground and configured to receive a select input and maintain the select input less than or equal to a potential of the ground, and a resistive element connected to an organic light emitting diode (OLED) and a first source/drain of the second transistor.

Another pixel circuit includes a first transistor, a second transistor connected to a first source/drain of the first transistor, a circuit element connected to a gate of the first transistor and ground and configured to receive a select input and downshift the select input in accordance with a pinch off voltage of the first transistor, and a resistive element connected to an organic light emitting diode (OLED) and a first source/drain of the second transistor.

A system includes select lines running parallel to one another in a first direction and data lines running parallel to one another in a second direction transverse to the first direction. A row driver is connected to the select lines to drive the select lines, and a column driver is connected to the data lines to drive the data lines. Pixel circuits are connected to the select lines and data lines at cross-over positions. The pixel circuits employ a circuit element connected to a gate of a first transistor and ground, which receives a select input and maintains the select input less than or equal to a potential of the ground, and a data line coupled to a first source/drain of the first transistor and a second source/drain of the first transistor, which is coupled to a gate of a second transistor. The second transistor has a drain connected to a supply voltage and a source connected to a resistive element. The resistive element connects to an organic light emitting diode (OLED), which connects to the ground.

Another system includes select lines and data lines, and pixel circuits connected to the select lines and the data lines at cross-over positions. The pixel circuits each employ a first transistor, a second transistor connected to a first source/drain of the first transistor, a circuit element connected to a gate of the first transistor and ground and configured to receive a select input and maintain the select input less than or equal to a potential of the ground, and a resistive element connected to an organic light emitting diode (OLED) and a first source/drain of the second transistor.

A method for forming a pixel circuit includes forming heterojunction field effect transistors (HJFET) on a substrate using low temperature polysilicon; forming a passivation layer over the HJFETs; forming a contact hole to a source of a HJFET; forming a transparent conductor that forms a contact in the contact hole and a resistor to control pixel current; and forming an organic light emitting diode (OLED) with an anode connecting to the resistor.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
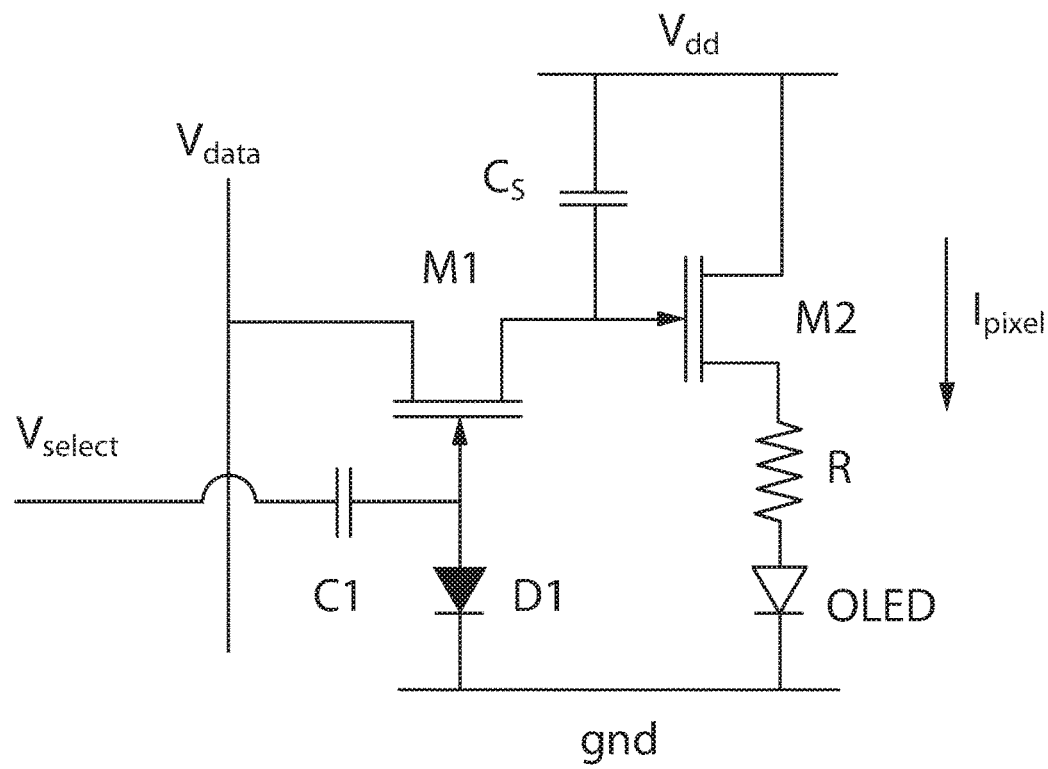
FIG. 1 is a schematic diagram showing a pixel circuit in accordance with one embodiment of the present invention.

In accordance with aspects of the present invention, active-matrix organic light-emitting diode (AMOLED) pixel circuits are disclosed. In one embodiment, each pixel circuit can include a switching junction field-effect transistor (JFET), a driver JFET, a storage capacitor, a direct current (DC) level-shifting diode/capacitor pair or stage and a substantially linear resistor connected between the driver JFET and the OLED. The diode can be implemented as a diode-connected JFET, e.g., using the gate terminal of the JFET as the first terminal (anode) of the diode, and using either or both the source and drain terminals of the JFET as the second terminal (cathode) of the diode. The pixel circuit can have the resistor implemented by configuring a contact resistance of a via contact made to the OLED anode. In another embodiment, JFETs are heterojunction field-effect transistor (HJFET) devices including hydrogenated Si based contacts on low-temperature poly-Si (LTPS).

In accordance with the present embodiments, the manufacturing cost and capital equipment cost is significantly reduced compared to conventional LTPS processes. The number of circuit elements employed in the pixel circuit of the AMOLED pixel is reduced, and therefore, the display resolution is improved as compared to conventional LTPS processes. The number of signal/data lines employed in the pixel circuit of the AMOLED pixel is reduced. Therefore, the display resolution is improved, and the complexity of the driving scheme (and therefore controller requirements) are reduced as compared to conventional LTPS processes. The number of mask steps is also reduced. The process temperature for forming the AMOLED pixel is reduced from 400-600° C. to about 200° C. and below. In addition, the use of low cost and/or flexible substrates such as plastic and conventional glass is made possible without compromising the device performance and system-level performance.

In useful embodiments, device and system-level performance is enhanced (for a given power consumption), or the power consumption is reduced (for a given system performance), compared to the conventional LTPS processes. This is due to aspects such as better HJFET device characteristics, including steeper subthreshold characteristics, among others.

The heterojunction field-effect transistor (HJFET), leverages the low-cost large-area advantages of amorphous Si and the higher performance of LTPS. The HJFET devices are comprised of amorphous Si-based contacts on LTPS substrates and have the following advantages over conventional LTPS TFTs: lower process temperature of 200° C. or below, higher TFT stability, steeper subthreshold characteristics, immunity to floating-body effects, lower noise, good uniformity, significant reduction in the fabrication cost/capital equipment cost by eliminating the expensive and/or high-temperature steps such as ion-implantation, doping activation, high-quality gate dielectric deposition, and enabling the use of low-cost and flexible substrates due to the low temperature fabrication process.

In applications such as cell phones and other portable devices, which are composed of various system components, it may be desirable for practical purposes that the replacement of the conventional TFTs with the HJFETs employ minimal or no change to the other system components or the overall system design conventionally used in such applications. In such cases, to take full advantage of the HJFET device and process benefits, two issues may need to be addressed in particular. These issues can include: since HJFET is a normally-on device, the conventional implementation of the pixel circuit does not permit sharing of a local common ground of the pixel with a global common ground shared by various other circuit and system components, and given the small size of the OLED in high-resolution displays, the drive current of the driver HJFET needs to be suppressed over the desired programming voltage range without compromising the switching performance of the switching HJFETs, which are fabricated monolithically. These issues are addressed in accordance with the present embodiments. Note that normally-off HJFETs are possible but are more complicated and have a lower drive current.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular s "a," "are" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower" "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, an AMOLED pixel circuit 10 is shown in accordance with one illustrative embodiment. The circuit 10 includes a switching junction field-effect transistor (JFET) M1, a driver JFET M2, a storage capacitor $C_S$, a DC level-shifting diode D1/capacitor C1 pair or stage and a substantially linear resistor R connected between the driver JFET M2 and an organic light emitting diode OLED. The storage capacitor $C_S$ and the driver JFET M2 are coupled to supply voltage ($V_{dd}$).

A DC level of a $V_{select}$ signal on the $V_{select}$ line is downshifted by the C1/D1 stage (which can include components in addition to or instead of the capacitor/diode pair), such that the lower level of $V_{select}$ is below a pinch off voltage (e.g., <−2V) and an upper level of $V_{select}$≤ground (gnd). Therefore, M1 can be switched on/off properly with $V_{select}$ above ground (gnd). The drain and source of M1 may each have a similar or essentially identical structure, and the particular designation as to whether such a terminal is a drain or a source follows the usual circuit conventions well known to those of ordinary skill in the art. For example, if the value of $V_{data}$ in a given frame time is increased with respect to that in the previous frame time, when M1 is selected the source/drain terminal of M1, which is connected to $V_{data}$, will be at a higher voltage than the other source/drain terminal of M1 which is connected to the gate of M2. Therefore, the source/drain terminal connected to $V_{data}$ will function as a drain terminal, and the source/drain terminal connected to the gate of M2 will function as a source terminal.

The diode D1 can be implemented as a diode-connected JFET, e.g., using the gate terminal of the JFET as the first terminal (anode) of the diode D1, and using either or both the source and drain terminals of the JFET as the second terminal (cathode) of the diode D1. In this way, the diode D1 can be fabricated concurrently with JFETs M1 and M2.

The OLED is connected to a source of M2, and a threshold voltage of the OLED is chosen to be larger than an absolute value of a pinch-off voltage of M2. Therefore, when a $V_{data}$ signal is 0, the pixel current, $I_{pixel}=0$, and the pixel circuit 10 operates properly with $V_{data}$ above ground (gnd).

The pixel circuit 10 solves a problem in conventional pixel circuits, which includes that negative voltages must be used for $V_{data}$ and $V_{select}$ with respect to the local ground since the HJFETs are normally-on devices. This means the local ground (gnd) of the backplane cannot be connected to a global ground where all the other local grounds (of various system components, e.g., in a cell phone) are connected. This is solved in accordance with the present embodiments by providing the DC level of the $V_{select}$ signal which is downshifted by the C1/D1 stage such that the lower level of $V_{select}$ is below the pinch off voltage and the upper level of $V_{select} \leq$ ground (gnd). Therefore, M1 can be switched on/off properly with $V_{select}$ above ground (gnd). The threshold voltage of the OLED is chosen to be larger than the absolute value of a pinch-off voltage of M2. Therefore, when the $V_{data}$ signal is 0, the pixel current, $I_{pixel}=0$, and the pixel circuit 10 operates properly with $V_{data}$ above ground (gnd).

Off-the-shelf column driver chips need a 2-3 voltage span for programming grayscale levels (e.g., 256) in OLED brightness. Therefore, the operation voltage range of M2 needs to be increased without (i) excessive current flow into the OLED and (ii) compromising switching performance of M1.

In accordance with aspects of the present invention, a relatively large resistance R (compared to the channel resistance of M2) is connected to the source of M2. As a result the pixel current ($I_{pixel}$) is limited to a desired range. The $V_{dd}$ dependence of $I_{pixel}$ is eliminated, so no resistive loss compensation with minimal modification of the backplane fabrication process. Efforts taken to reduce the OLED threshold voltage in conventional pixels (e.g., high-quality indium tin oxide (ITO) deposition, work function adjustment of ITO by $O_2$ plasma or UV ozone treatment) may no longer be needed.

The number of transistors and signals are reduced, which enables higher image resolution (e.g., a diode can be implemented as a HJFET with one drain/source, thus occupying smaller area than an HJFET). The circuit 10 takes advantage of all the device, process and cost advantages of the HJFET fabrication.

In one illustrative example, current limits on the OLED can include the following. OLED area can be ~20 μm×20 μm. A fill-factor (OLED/subpixel area ratio)=50% with polarizer loss of about 50% and all other brightness losses about 50%. Subpixels include red, green and blue (RGB) (3 colors). A maximum pixel brightness is ~500 Cd/m² and the OLED luminance efficiency is about 10 Cd/A. In accordance with the circuit 10, the maximum pixel current=maximum OLED current=500 (Cd/m²)/(10 (Cd/A)×(2 μm)²×2×2×2× 3)≈500 nA. The maximum pixel current of a conventional circuit using an HJFET driver without a control resistor would be ~1000× higher than this value.

The pixel current may be reduced by increasing the channel sheet resistance of M2; however, if M1 and M2 use the same channel material, this will compromise the switching performance of M1. Using different channel materials, different gate stacks, etc. for M1 and M2 will increase the number of masks (and may also complicate the process) and therefore not be cost-effective and/or practical. In principle, M1 and M2 may be implemented with a wide channel length and width, respectively (e.g., W/L=2 μm/30 μm and 30 μm/2 μm) but this may not be practical due to area constraints.

In accordance with aspects of the present invention, the resistance R is connected to the source of M2 and limits the current $I_{pixel}$ to the desired range. The resistance R at the source of M2 can limit the pixel current $I_{pixel}$. For example: $V_p \approx -2.5V$, W/L≈2.5, R≈5MΩ), where $V_p$ is pinch off voltage. So far as the drain voltage $V_D$ is high enough to ensure M2 is in saturation ($V_D > \sim -2.5V$ in this example), the drain current ($I_D$) will have no dependence on the drain voltage: $I_D = I_{SS} [1-(V_{GS}-RI_D)/V_p]^2 \approx (V_{GS}-V_p)/R$, where $V_{GS}$ is the gate to source voltage of M2 and $I_{SS}$ is the drain saturation current. Therefore, the pixel current $I_{pixel}$ becomes independent of $V_{dd}$ and no compensation will be needed for resistive loss on the $V_{dd}$ line. M2 is coupled to the supply voltage $V_{dd}$ and the pixel current $I_{pixel}$ flows through M2, R and the OLED. The resistor R limits the pixel current $I_{pixel}$ to a desired range, and the supply voltage $V_{dd}$ biases M2 within a saturation regime so that supply voltage dependence of the pixel current $I_{pixel}$ is reduced or eliminated.

Figure 2A:
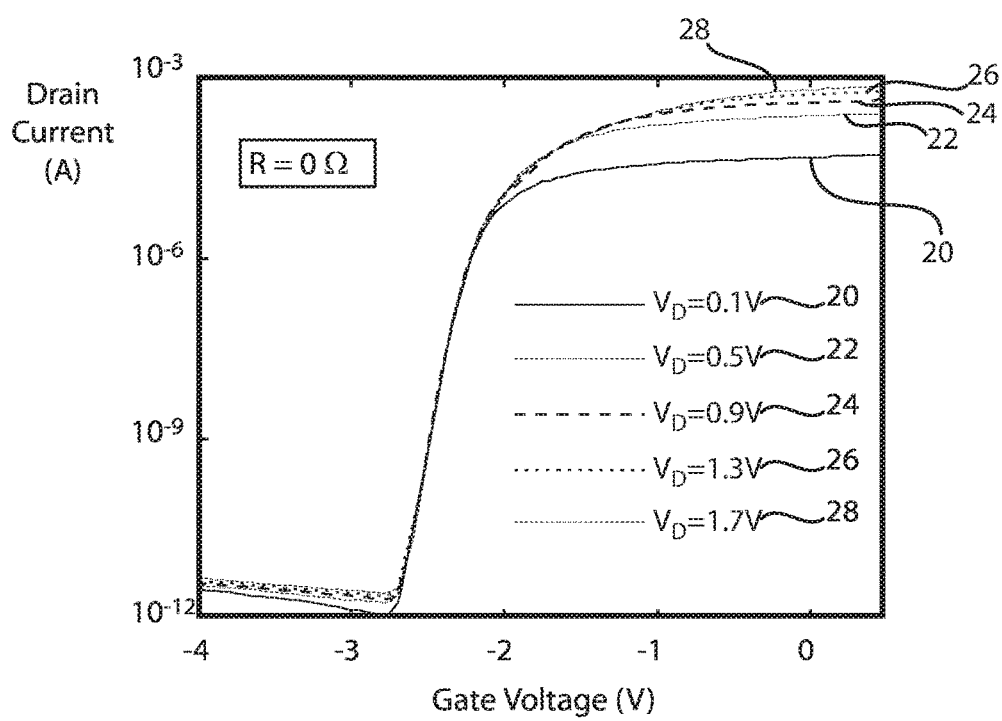
FIG. 2A is a plot showing drain current (A) (logarithm) versus gate voltage (V) for different drain voltages with a resistor R having a value of 0 Ohms (i.e., no resistor), in accordance with one embodiment.
Figure 2B:
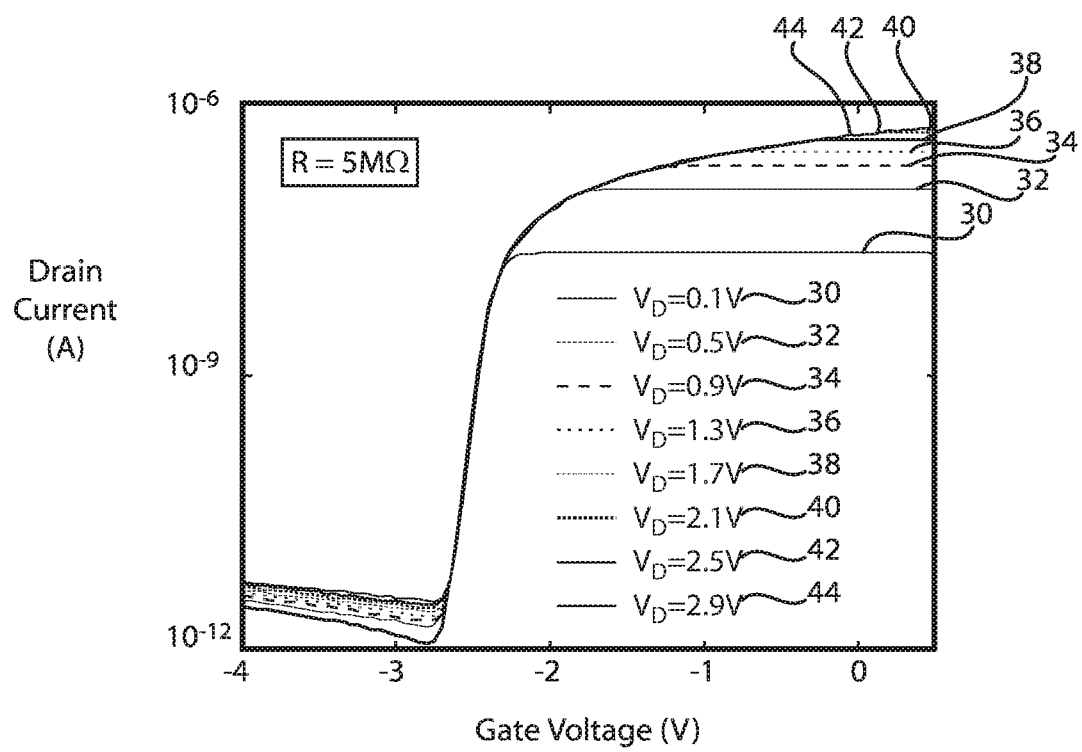
FIG. 2B is a plot showing drain current (A) (logarithm) versus gate voltage (V) for different drain voltages with a resistor R having a value of 5 MOhms in accordance with another embodiment.
Figure 2C:
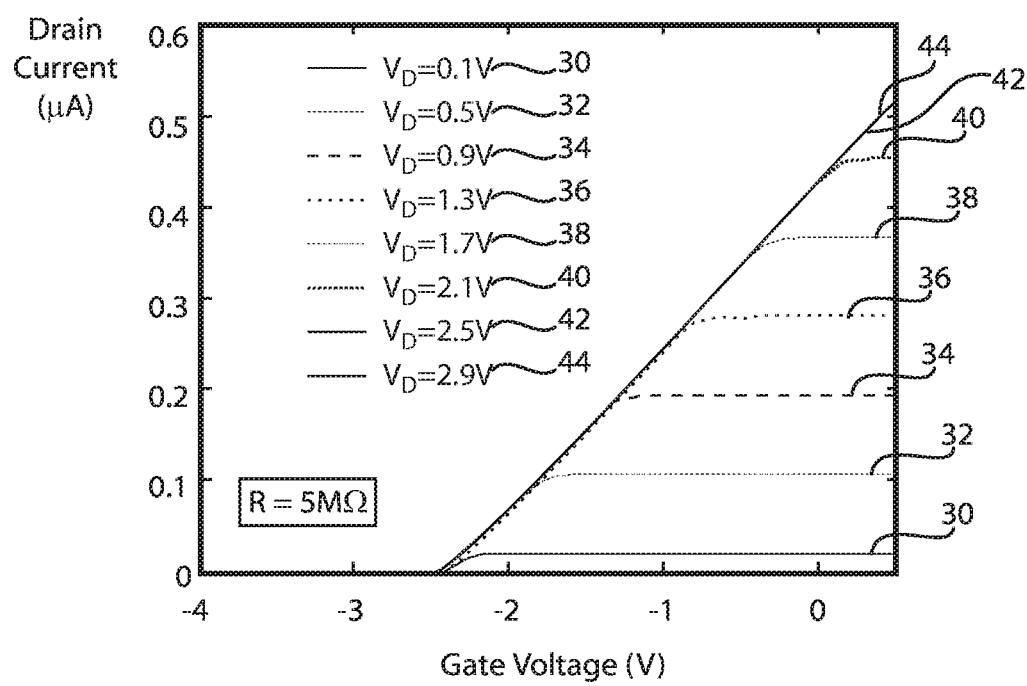
FIG. 2C is a plot showing drain current (microA) versus gate voltage (V) for different drain voltages with a resistor R having a value of 5 MOhms in accordance with another embodiment.

Referring to FIGS. 2A-2C, plots of drain current versus gate voltage for M2 are illustratively depicted to show the stability and performance of the pixel circuit 10. In FIG. 2A, the log of drain current (A) is plotted versus gate voltage (V) for a plurality of drain voltages ($V_D$) of M2 where R is 0 Ohms (no resistor). In plot 20, $V_D$ is 0.1V. In plot 22, $V_D$ is 0.5V. In plot 24, $V_D$ is 0.9V. In plot 26, $V_D$ is 1.3V. In plot 28, $V_D$ is 1.7V. In preferred embodiments, M1 is fabricated using the same process as M2, and therefore M1 has the same characteristics as M2 when R is 0 Ohms, as plotted in FIG. 2A. The steep slope of the drain current ($I_D$) at the gate voltage between −2 and −3V provides the improved switching performance for M1 and addresses concerns for conventional devices. Also, the high drive current ($I_D$ at the gate voltage between −2 and 0V) is desirable for the good switching performance of M1. However, when R is 0 Ohms, the drive current (in the saturation regime) may be too high for driving an OLED.

In FIG. 2B, drain current (A) is plotted on a logarithmic scale versus gate voltage (V) for a plurality of drain voltages ($V_D$) of M2 where R is 5 MOhms. In plot 30, $V_D$ is 0.1V. In plot 32, $V_D$ is 0.5V. In plot 34, $V_D$ is 0.9V. In plot 36, $V_D$ is 1.3V. In plot 38, $V_D$ is 1.7V. In plot 40, $V_D$ is 2.1V. In plot 42, $V_D$ is 2.5V. In plot 44, $V_D$ is 2.9V.

In FIG. 2C, drain current (microA) is replotted on a linear scale versus gate voltage (V) for a plurality of drain voltages ($V_D$) of M2 where R is 5 MOhms. In plot 30, $V_D$ is 0.1V. In plot 32, $V_D$ is 0.5V. In plot 34, $V_D$ is 0.9V. In plot 36, $V_D$ is 1.3V. In plot 38, $V_D$ is 1.7V. In plot 40, $V_D$ is 2.1V. In plot 42, $V_D$ is 2.5V. In plot 44, $V_D$ is 2.9V.

In all instances, the gate voltage transitions are well-defined and correlate well despite changes in the drain voltage $V_D$, so far as $V_D$ is large enough to ensure M2 is in saturation. This supports that the pixel current $I_{pixel}$ becomes independent of $V_{dd}$, and no compensation is needed for resistive loss on the $V_{dd}$ line. Also, when R is 5 MOhms, the drive current is reduced by ~1000 times compared to when R is 0 Ohms, as desired for driving an OLED.

Figure 3:
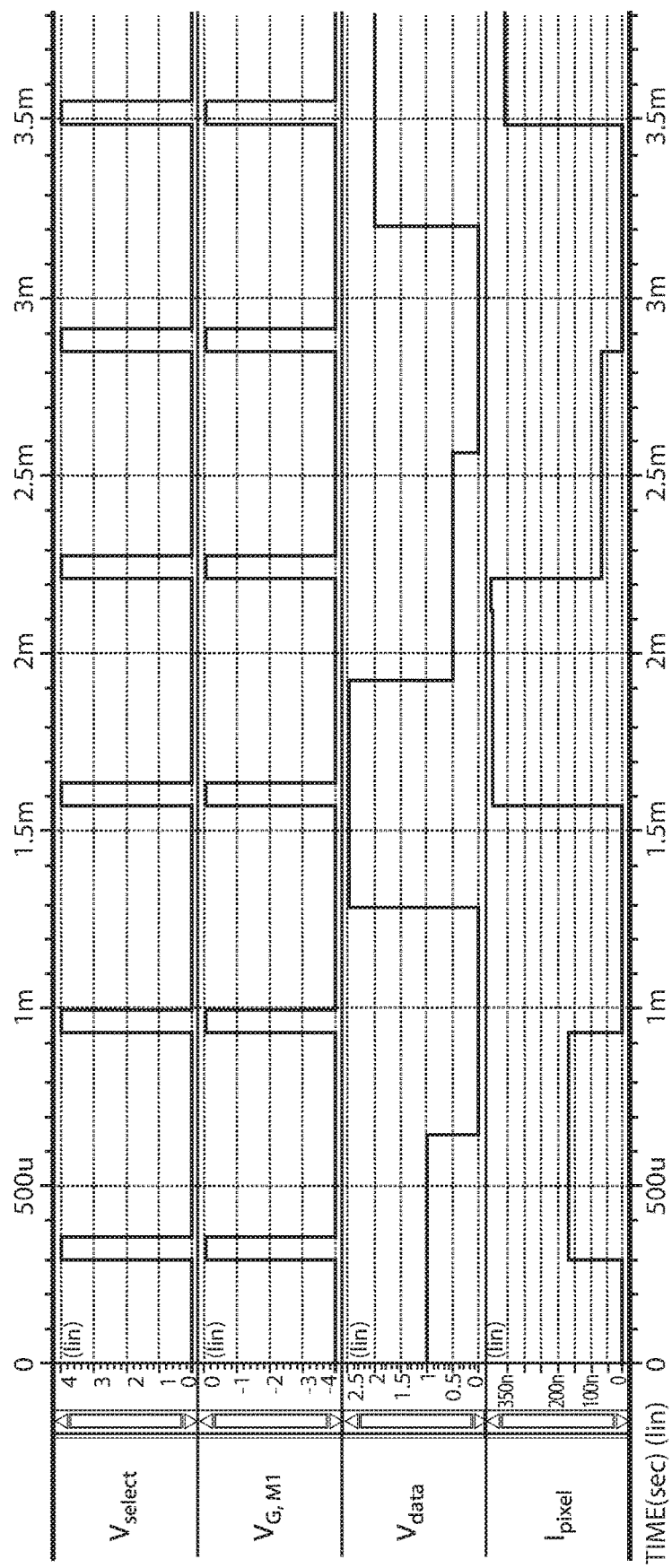
FIG. 3 is a simulated timing diagram for the pixel circuit of FIG. 1 showing a relationship between $V_{data}$ and $I_{pixel}$ in accordance with one embodiment.

Referring to FIG. 3, a timing diagram of an HSPICE™ simulation shows relationships between $V_{select}$, $V_{G,M1}$ (gate voltage of M1), $V_{data}$ and $I_{pixel}$ in the pixel circuit 10. Note that the frame-time used was 640 microseconds instead of 16 milliseconds for better illustration of the waveforms. According to the simulation $I_{pixel}$ tracks $V_{data}$ very well.

Figure 4:
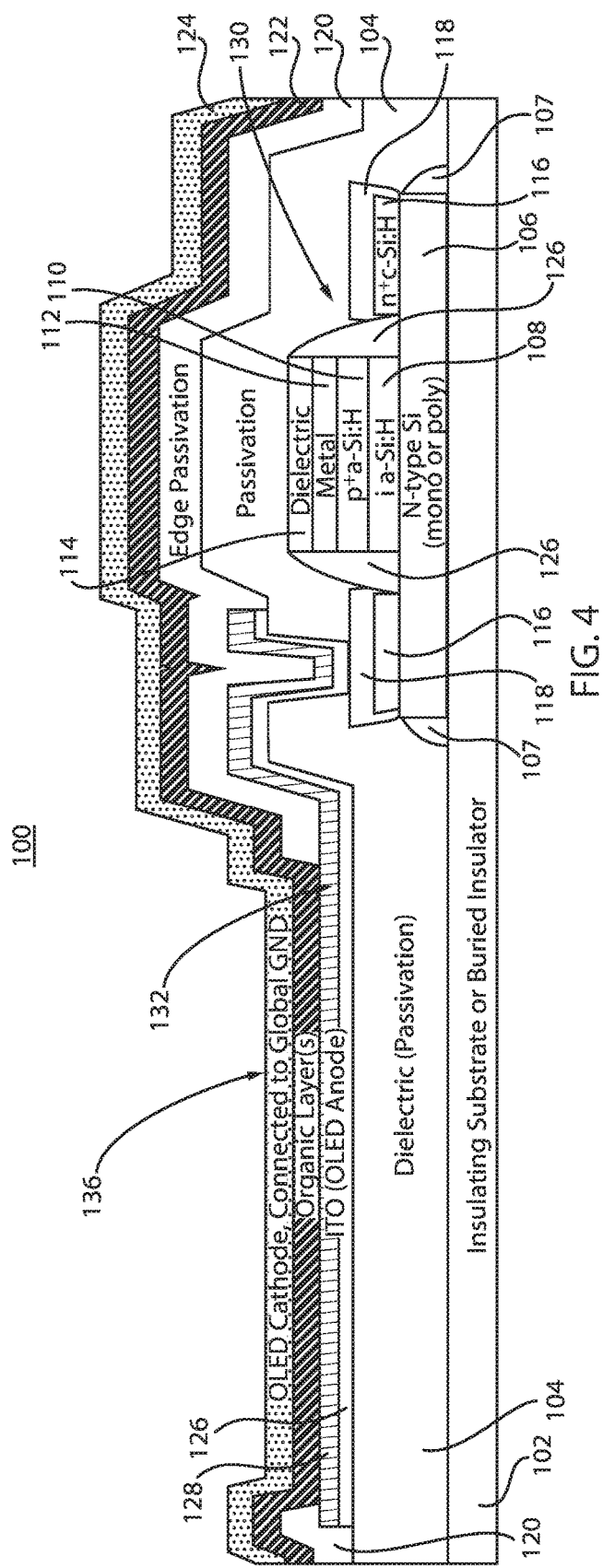
FIG. 4 is a cross-sectional view showing a heterojunction field effect transistor connected to an organic light emitting diode (OLED) by a transparent conductor that forms a resistor using a bilayer of materials in accordance with an embodiment of the present invention.

Referring to FIG. 4, a cross-sectional view of a portion 100 of a pixel including a driver heterojunction field effect transistor (HJFET) 130 and an OLED 136 is shown in accordance with one embodiment. The portion 100 includes a substrate 102 that can be consistent with LTPS (low-temperature polysilicon) processing, which can include an insulator or buried insulator material. The substrate 102 can include glass or a plastic material including but not limited to a flexible material. A channel region 106 is formed on and patterned on the substrate 102. The channel region 106 can include an N-type material, such as an N-doped silicon (Si). The channel region 106 can include a monocrystalline or polycrystalline material structures. The channel region 106 preferably includes low-temperature poly-silicon (LTPS). While an N-type material is described, one skilled in the art would understand the P-type materials may also be employed.

A gate stack is formed, which may include an intrinsic hydrogenated amorphous Si (i a-Si:H) layer 108, an amorphous p+Si layer (p+a-Si:H layer) 110, a metal layer 112 and a dielectric cap 114. The i a-Si:H/p+a-Si:H stack forms a heterojunction on the N-doped channel material, e.g., LTPS. The a-Si:H layers and/or the dielectric cap used in the gate stack can be formed using plasma enhanced chemical vapor deposition (PECVD) at a temperature of equal to or less than about 200 degrees C. Spacers 126 are formed on the gate stack. The formation of the spacers 126 may also result in the formation of the dielectric spacers 107 on the ends of the channel region 106. Dielectric spacers 107 are of no significance with respect to the operation of the HJFET 130.

Source/drain (S/D) regions 116 are formed on the channel region 106 adjacent to the gate stack. The S/D regions 116 can include n+ hydrogenated crystalline Si(c-Si:H). The n+ c-Si:H of the S/D regions 116 can be formed using PECVD at a temperature of equal to or less than about 200 degrees C. In one example, n+ hydrogenated Si (n+Si:H) is deposited from a mixture of $SiH_4$, $PH_3$ and $H_2$, such that $[H_2]/[SiH_4] >5$, resulting in epitaxial growth, e.g., n±c-Si:H growth on the exposed surfaces of the N-type Si substrate 106, and a-Si:H growth on all the other surfaces, including the insulating substrate 102, spacers 126 and 107, and the dielectric cap 114. The n±a-Si:H portion of the n±Si:H layer is then selectively etched, e.g., using an in-situ $H_2$ plasma, leaving behind the n±c-Si:H. Note that there are no lightly doped drain (LDD) regions next to the S/D regions 116, which have been omitted. A silicide or metal contact layer(s) 118 are formed on the S/D regions 116. The HJFET 130 formed using this exemplary process is configured as a normally-ON thin film transistor (TFT) by choosing a channel region thickness ($t_{Si}$) and doping concentration ($N_D$) that results in a negative pinch-off voltage ($V_p$). In one example, $t_{Si}$=50 nm (Si thickness) and $N_D$=3×10$^{18}$ cm$^{-3}$ resulting in $V_p \approx -2.5V$. Other parameters are also contemplated.

A passivation layer 104 is formed over the driver HJFET 130 and patterned to form contact holes. A transparent conductor layer or metal layer forms an OLED anode 132, which is formed in the contact hole. The transparent conductor layer or OLED anode 132 can include indium tin oxide (ITO) or other transparent conductive materials. The transparent conductor layer 132 is employed to form the resistance R. The resistance R can be obtained, e.g., by deliberately increasing a specific contact resistance between the OLED anode 132 and the source/drain metal or silicide 118.

In one example, the ITO of layer 132 is deposited as a bi-layer, a first layer 126 is intended to deliberately increase the contact resistance (e.g., by having a higher oxygen content), and a second layer 128 is deposited under usual conditions.

Figure 5:
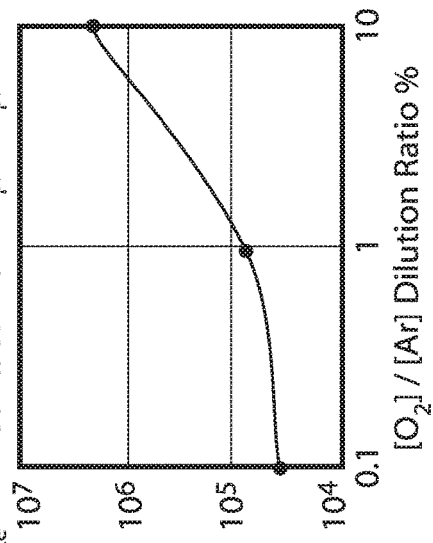
FIG. 5 is a plot showing contact resistance (Ohms) versus dilution ratio (%) between oxygen and argon and showing dependence of contact resistance on the dilution ratio to control a value of the resistor in accordance with an embodiment of the present invention.

Referring to FIG. 5, a plot of contact resistance (Ohms) versus $[O_2]/[Ar]$ dilution ratio (%) is shown providing experimental verification for the conditioning of layer 126 to provide adjustment to R. Specific contact resistance between ITO of layer 126 and Cr (layer 118) was measured versus the $[O_2]/[Ar]$ ratio during ITO sputtering, showing that a contact resistance of a few MΩ can be obtained for a contact area of 2 μm×2 μm by increasing the ratio from 0.1% (typical) to about 10%. Other conditions used for ITO deposition included pressure: ~4 mtorr, RF power: ~0.5 W/cm$^2$, and target-to-substrate gap: 3-4 inches. In other examples, deviating these conditions can also be employed to increase (or decrease) contact resistance, as needed.

Referring to again to FIG. 4, the process continues with the formation of edge passivation 120. Organic layers 122 are deposited to form the OLED 136. An OLED cathode layer 124 is formed. The OLED cathode layer 124 is connected to a global ground and is not limited to being connected to local grounds in accordance with the present embodiments.

The resistance R may be implemented using other methods, materials and structures, e.g., vertical or lateral (geometrical) resistance can be employed. Such methods can include the use of doped a-Si:H layers. In some embodiments, the same a-Si:H layers used for the HJFET process can be employed. Some or part of the patterning/metallization process can combined with/or performed in parallel with the backplane process.

One illustrative formation method includes forming heterojunction field effect transistors (HJFET) on a substrate using low temperature polysilicon technology, forming a passivation layer over the HJFETs and forming a contact hole to a source of a HJFET. A transparent conductor is deposited to form a contact in the contact hole and to form a resistor to control pixel current. An organic light emitting diode (OLED) is formed with an anode connecting to the resistor. Other components can be formed concurrently, e.g., including diodes, transistors, capacitors, etc. The resistor can be formed as a bilayer, a liner in a contact hole, a vertical stack of materials, a bridge formed in a lateral break in the transparent conductor or metal layer which forms or is connected to the OLED anode, etc.

Figure 6:
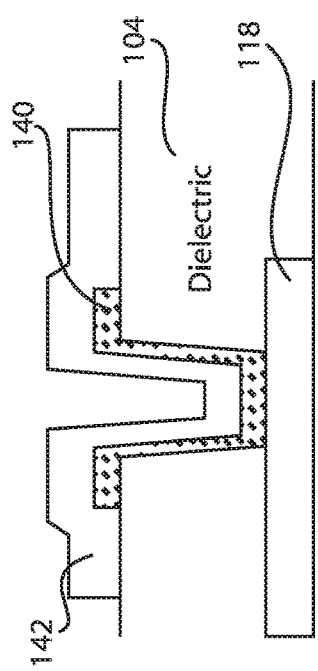
FIG. 6 is a cross-sectional view showing a liner forming the resistor in a vertical resistor stack configuration in accordance with an embodiment of the present invention.

Referring to FIG. 6, a liner 140 is formed in a contact hole in the passivation layer 104 to contact the silicide, metal (e.g., Cr) or ITO of layer 118. The liner 140 can include a metal, ITO or other material to provide the resistance R. A transparent conductor 142 (e.g., 128) can be formed over the lines 140.

Figure 7:
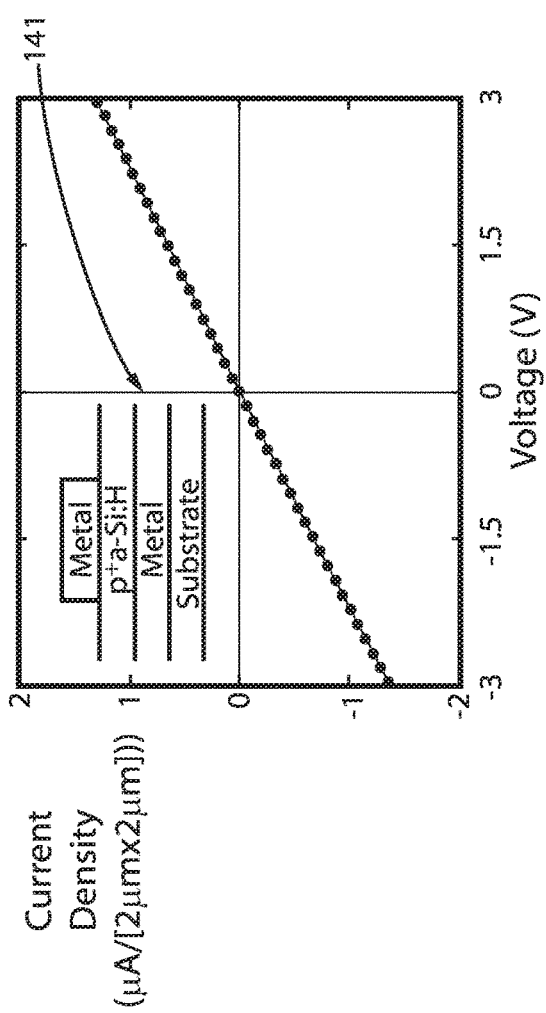
FIG. 7 is a cross-sectional view showing a plot of current density in (microA/2×2 microns) versus voltage (V) for a vertical stack forming the resistor in a vertical resistor configuration in accordance with an embodiment of the present invention.

Referring to FIG. 7, an experimental example shows a plot of current density is microA) versus voltage (V) for a Cr/p+ a-Si:H (20 nm)/Cr vertical stack 141 that can implement a~2.5MΩ resistance in a 2 μm×2 μm area, with good linearity and negligible photoconductivity (the latter not being shown in the plot). The vertical stack 141 can be employed as the layer 118, liner 140 and layer 142 in FIG. 6. Additional layers may also be included in the vertical stack. Other structures and methods may also be employed to provide R.

Figure 8:
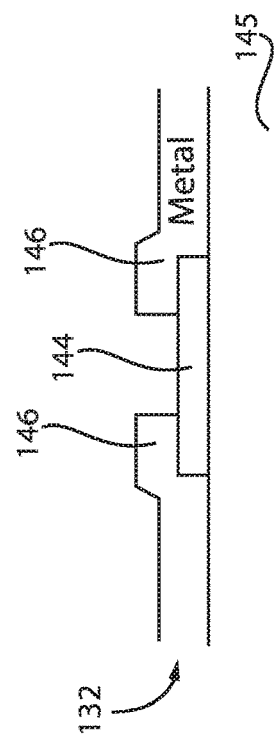
FIG. 8 is a cross-sectional view showing a bridge forming the resistor in a lateral resistor configuration in accordance with an embodiment of the present invention.

Referring to FIG. 8, lateral structures can also be implemented to provide resistance R. In one useful embodiment, $n^+$ a-Si:H can be employed as a bridge 144 which has a sheet resistance of a few MΩ/□ at 10-20 nm in thickness. Other materials can also be employed. The bridge 144 is suitable for geometries on the order of about 2 μm in width and length. The bridge 144 is formed on a dielectric or substrate 145 before a metal or ITO 146 is formed. The anode 132 would include a break in the metal or ITO 146, which is bridged by the bridge 144 to provide the needed resistance.

Figure 9:
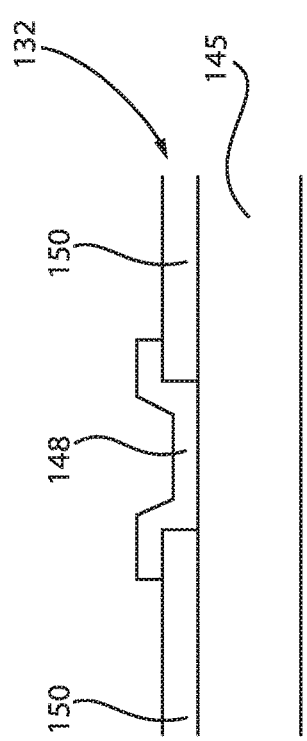
FIG. 9 is a cross-sectional view showing another bridge forming the resistor in a lateral resistor configuration in accordance with an embodiment of the present invention.

Referring to FIG. 9, another lateral structures can also be implemented to provide resistance R. In one useful embodiment, $n^+$ a-Si:H can be employed as a bridge 148 which has a sheet resistance of a few MΩ/□ at 10-20 nm in thickness. Other materials can also be employed. The bridge 148 is suitable for geometries on the order of about 2 μm in width and length. The bridge 148 is formed on a dielectric or substrate 145 after a metal or ITO 146 is formed. The anode 132 would include a break in the metal or ITO 146, which is bridged by the bridge 148 to provide the needed resistance.

It will be appreciated by those skilled in the art that the provided examples are not exhaustive and that other geometries, materials or methods may be used to implement R. In the implementation methods shown, minimal changes in the process flow for forming HJFET structures is provided.

Figure 10:
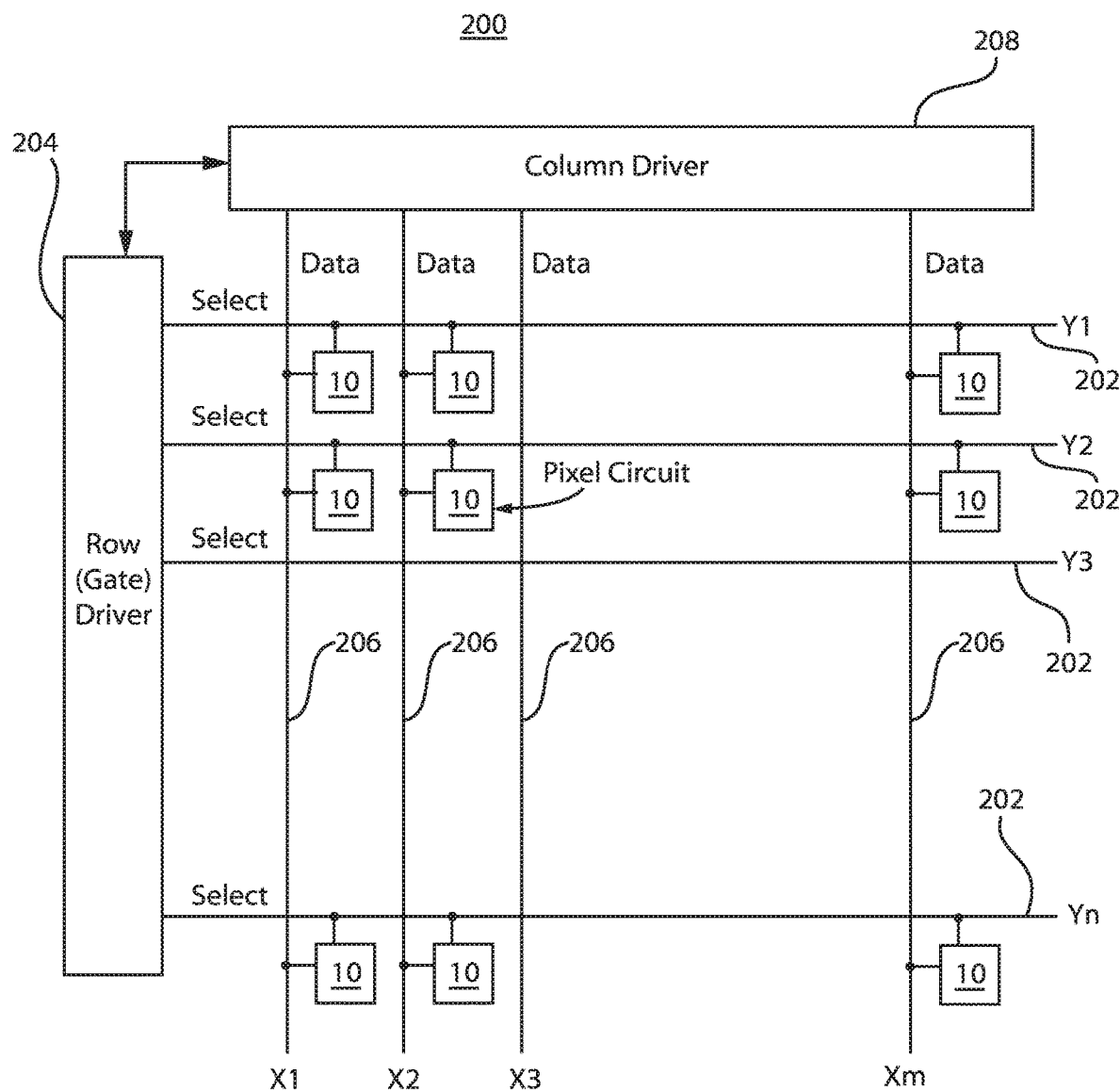
FIG. 10 is a schematic diagram showing a cross-over pixel array circuit in accordance with an embodiment of the present invention.

Referring to FIG. 10, the pixel circuits 10 can be incorporated into an active matrix array 200. The active matrix array 200 includes select lines (Y) 202 connected to a row or gate driver circuit 204 at a periphery of the array 200. The active matrix array 200 includes data lines (X) 206 coupled to a column driver circuit 208 at a periphery of the array 200. Pixel circuits 10 are selectively coupled to the select lines 202 and data lines 206 to activate the pixel circuits 10 to drive pixels (e.g., RBG subpixels) to generate an image for a display device.

Figure 11:
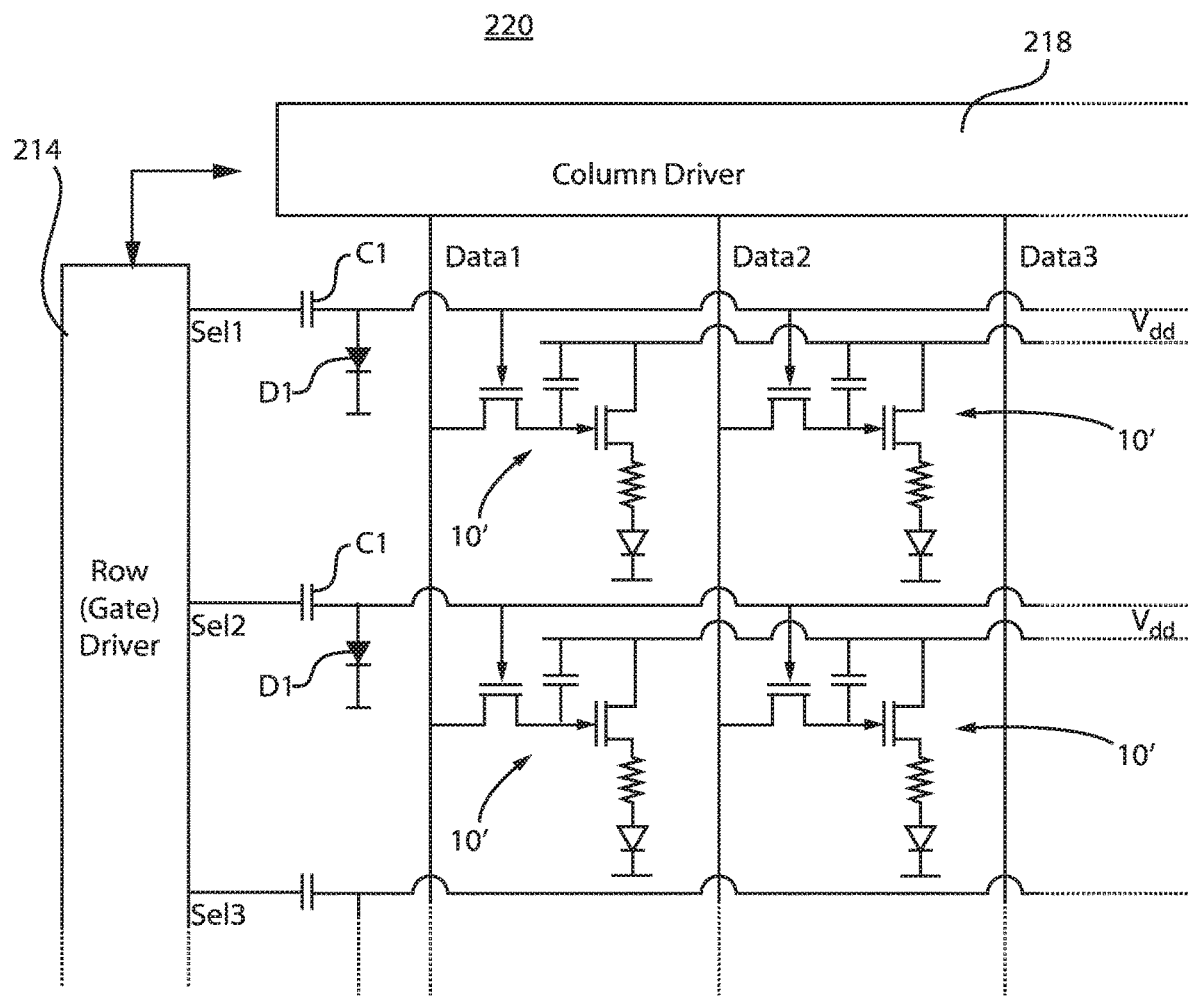
FIG. 11 is a schematic diagram showing a cross-over pixel array circuit where a capacitor/diode stage is shared in each row in accordance with another embodiment of the present invention.

Referring to FIG. 11, in another embodiment, where narrow bezel (edge) is not critical, C1 and D1 can be moved to a gate driver side of an array 220 (panel) to enable further reduction of pixel size. Note larger C1 and D1 are employed to drive all gates in a row rather than just a single gate. In one embodiment, the $V_{dd}$ line can be connected to a column driver 218, a row (gate) driver 214, or another power supply (not shown). The grounds may be connected to the OLED cathode which can be blanket deposited in the array 220 (e.g., commonly connect to multiple pixel circuits to provide a global ground).

The pixel circuits 10' can be incorporated into the active matrix array 220 with the remaining components. The active matrix array 220 includes select lines (Sel1-Sel3)) connected to the row or gate driver circuit 214 at a periphery of the array 220. The active matrix array 220 includes data lines (Data1-Data3) coupled to the column driver circuit 218 at a periphery of the array 220. Pixel circuits 10' are selectively coupled to the select lines and data lines to activate the pixel circuits 10' to drive pixels (e.g., RBG subpixels) to generate an image for a display device.

Having described preferred embodiments for active matrix OLED display with normally-on thin-film transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A pixel circuit, comprising:
   a first transistor;
   a second transistor connected to a first source/drain of the first transistor;
   a circuit element connected to a gate of the first transistor and ground and configured to receive a select input and maintain the select input less than or equal to a potential of the ground; and
   a resistive element connected to an organic light emitting diode (OLED) and a first source/drain of the second transistor, the OLED having a threshold voltage greater than an absolute value of a pinch off voltage of the second transistor.

2. The pixel circuit as recited in claim 1, wherein the circuit element is further configured to downshift the select input in accordance with a pinch off voltage of the first transistor.

3. The pixel circuit as recited in claim 1, wherein the second transistor is coupled to a supply voltage and a pixel current flows through the second transistor, the resistive element and the OLED, the resistive element limits the pixel current to a range, and the supply voltage biases the second transistor within a saturation regime so that supply voltage dependence of the pixel current is reduced or eliminated.

4. The pixel circuit as recited in claim 1, wherein the resistive element includes a transparent conductor that connects a source/drain of the second transistor to an anode of the OLED.

5. The pixel circuit as recited in claim 4, wherein the transparent conductor includes a bilayer including a high resistance layer formed using a dilution ratio of formation gases.

6. The pixel circuit as recited in claim 4, wherein the transparent conductor is formed on a liner in a contact hole corresponding with the source of the second transistor.

7. The pixel circuit as recited in claim 6, wherein the liner includes a vertical stack of materials.

8. The pixel circuit as recited in claim 4, wherein the transparent conductor is formed with a lateral break and a bridge is formed in the lateral break to provide the resistive element.

9. The pixel circuit as recited in claim 1, wherein the ground includes a global ground.

10. The pixel circuit as recited in claim 9, wherein the global ground is blanket deposited over an array of pixel circuits.

11. The pixel circuit as recited in claim 1, wherein the first and second transistors include low temperature polysilicon (LTPS) material.

12. The pixel circuit as recited in claim 1, further comprising a data line coupled to a second source/drain of the first transistor, wherein the second transistor further includes a second source/drain connected to a supply voltage.

13. A pixel circuit, comprising:
   a first transistor;
   a second transistor connected to a first source/drain of the first transistor;

a circuit element connected to a gate of the first transistor and ground and configured to receive a select input and downshift the select input in accordance with a pinch off voltage of the first transistor; and a resistive element connected to an organic light emitting diode (OLED) and a first source/drain of the second transistor, the OLED having a threshold voltage greater than an absolute value of a pinch off voltage of the second transistor.

14. The pixel circuit as recited in claim 13, wherein the circuit element is further configured to maintain the select input less than or equal to a potential of the ground.

15. The pixel circuit as recited in claim 13, further comprising a data line coupled to a second source/drain of the first transistor, wherein the second transistor further includes a second source/drain connected to a supply voltage.

16. The pixel circuit as recited in claim 13, wherein the resistive element includes a transparent conductor that connects the source of the second transistor to an anode of the OLED.

17. The pixel circuit as recited in claim 16, wherein the transparent conductor is selected from the group consisting of: a bilayer, a transparent conductor formed on a liner in a contact hole, a transparent conductor including a vertical stack of materials and a transparent conductor formed with a bridge formed in a lateral break to provide the resistive element.

18. A pixel circuit, comprising:
a first transistor;
a second transistor connected to a first source/drain of the first transistor;
a circuit element connected to a gate of the first transistor and ground and configured to receive a select input and maintain the select input less than or equal to a potential of the ground; and
a resistive element connected to an organic light emitting diode (OLED) and a first source/drain of the second transistor;
wherein the second transistor is coupled to a supply voltage and a pixel current flows through the second transistor, the resistive element and the OLED, the resistive element limits the pixel current to a range, and the supply voltage biases the second transistor within a saturation regime so that supply voltage dependence of the pixel current is reduced or eliminated.

* * * * *